US009966911B2

(12) United States Patent
Morris

(10) Patent No.: US 9,966,911 B2
(45) Date of Patent: May 8, 2018

(54) CAPACITANCE MINIMIZATION SWITCH

(71) Applicant: Dialog Semiconductor GmbH, Kirchheim/Teck-Nabern (DE)

(72) Inventor: Tim Morris, Loerrach (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days. days.

(21) Appl. No.: 14/055,629

(22) Filed: Oct. 16, 2013

(65) Prior Publication Data
US 2015/0097621 A1    Apr. 9, 2015

(30) Foreign Application Priority Data
Oct. 7, 2013  (EP) ..................... 13368037

(51) Int. Cl.
H03F 3/45     (2006.01)
H03K 17/14    (2006.01)
H03K 17/16    (2006.01)
H03F 1/08     (2006.01)

(52) U.S. Cl.
CPC ......... *H03F 3/45179* (2013.01); *H03F 1/086* (2013.01); *H03K 17/145* (2013.01); *H03K 17/161* (2013.01); *H03K 2217/0054* (2013.01)

(58) Field of Classification Search
CPC ............... H03K 17/063; H03K 17/162; H03K 17/6874; H01L 27/088
USPC .......................... 327/382, 379, 434, 551, 552
See application file for complete search history.

(56) References Cited

U.S. PATENT DOCUMENTS

| 5,550,503 | A  | * | 8/1996  | Garrity et al. ................. 327/437 |
| 6,150,884 | A  |   | 11/2000 | Fattaruso |
| 6,462,611 | B2 |   | 10/2002 | Shigehara et al. |
| 8,344,802 | B2 |   | 1/2013  | Huang et al. |
| 8,344,808 | B2 |   | 1/2013  | Samavedam et al. |
| 8,400,848 | B2 |   | 3/2013  | Fujimura |
| 2002/0036576 | A1 | | 3/2002  | Saito |
| 2006/0164164 | A1 | | 7/2006  | Rogers et al. |

OTHER PUBLICATIONS

European Search Report, 13368037.1-1805, dated Mar. 25, 2014, Dialog Semiconductor GmbH.

* cited by examiner

*Primary Examiner* — Lincoln Donovan
*Assistant Examiner* — Colleen O Toole
(74) *Attorney, Agent, or Firm* — Saile Ackerman LLC; Stephen B. Ackerman

(57) ABSTRACT

A CMOS transmission gate that is compensated for lost current to parasitic capacitance. Parasitic capacitance current is detected by an amplifier and fed back in-phase to the input of the CMOS transmission gate with the gain of the amplifier set to avoid circuit instability. In a first example a transconductance amplifier detects a voltage drop across a resistor in and RC network and the resulting current applied to the input of the transmission gate. A second example uses a current amplifier to detect gate current of the N-channel and P-channel transistors of the transmission gate, and an output current is fed back in phase to the input of the CMOS transmission gate.

5 Claims, 3 Drawing Sheets

US 9,966,911 B2

CAPACITANCE MINIMIZATION SWITCH

TECHNICAL FIELD

The present disclosure is related to integrated circuit switches, and in particular with switches designed to minimize effects of parasitic capacitance.

BACKGROUND

Semiconductor switches are utilized in electronic circuits to control when a signal is allowed to propagate from one node to another. An implementation of such a switch in CMOS technology is the transmission gate (examples shown in FIGS. 1A and 1B), comprising NMOS and PMOS transistors connected in parallel for the purpose of allowing good conductivity for a wide signal voltage range. There are a number of different ways in which combinations of transistors can be connected together to implement a switch function; however, they all perform the same basic function of connecting two nodes when "on", and isolating the two nodes when "off". For DC signals inside an intended operating range, a switch appears like a resistor, the impedance depending on the architecture used and the dimensions of the transistors. There can also be dependence on the DC level of the signal for most architectures.

In FIG. 1A is shown a data switch of prior art comprising an N-channel transistor 10 and a P-channel transistor 11 connected in parallel, where the sources of the two transistors are connected together to form a data input A and the drains of the two transistors are connected to form data output B. An ON signal, a high logic signal, is applied to the gate of the N-channel transistor 10 and through an inverter circuit 12 to the gate of the P-channel transistor 11. To turn off the switch an off signal, which is a low logic signal, is applied to the gate of the N-channel transistor and through the inverter circuit to the gate of the P-channel transistor.

In FIG. 1B is a second data switch of prior art where a second parallel connected pair of transistors, an N-channel transistor 15 and a P-channel transistor 16, are connected in tandem 13 with a first pair of transistors 10 and 11. An N-channel transistor 14 is used to ground the tandem connection 13 to insure isolation between A and B.

A semiconductor switch presents a resistance to AC signals inside the intended operating range, but parasitic capacitance is also present. The impedance of the parasitic capacitive will present an AC path to the power supplies and chip substrate, and will ultimately cause signal attenuation at higher frequencies. In addition there will be capacitive impedance between the two sides of the switch that will cause some signal propagation when in the "off" state, thus reducing the isolation of the switch against higher frequency signals. A disadvantage of prior-art switch design shown in FIG. 1A is that lower resistive impedance in the "on" state dictates larger transistors. Larger transistors inherently include larger unwanted capacitances; therefore strong switches with low on-resistance also have larger parasitic capacitances, which limit the maximum frequency of a switched signal.

The purpose of the switches in FIGS. 1A and 1B is to make the voltage at node B equal to the voltage at node A while in the "on" state. Any change in the signal voltage at nodes A and B will require the total sum of all parasitic capacitances to be charged, or discharged, by a charge, $\Delta Q$, equal to the sum of capacitances multiplied by the change in voltage, $\Delta Q = C \cdot \Delta V$. Thus the faster the signal frequency, the higher the current required to charge and discharge the parasitic capacitances, $i = C \cdot dv/dt$.

US 2006/0164164 A1 (Rogers et al.) is directed to compensating for parasitic capacitances in a VCA circuit. U.S. Pat. No. 8,400,848 B2 (Fujimura) is directed to a bit line capacitance compensation capacitor, which compensates the capacitance of the bit line, and a peripheral capacitance compensation capacitor, which compensates the peripheral capacitance of the bit line. In U.S. Pat. No. 8,344,808 B2 (Samavedam et al.) a capacitance compensation is directed to using a compensation device coupled to a gain device. U.S. Pat. No. 8,344,802 B2 (Huang et al.) is directed to an operational amplifier device capable of using transmission gates for capacitance compensation. U.S. Pat. No. 6,462,611 B2 (Shigehara et al.) is directed to body effect compensation for electronic switches connected between two terminals. In U.S. Pat. No. 6,150,884 (Fattaruso) an improved operational amplifier circuit with nested transconductance is directed to capacitance compensation.

SUMMARY

It is objectives of the present disclosure is to sense current diverted from a CMOS transmission gate and inject that current into the input of the transmission gate.

It is also an objective of the present disclosure to sense a voltage across a resistor in an RC network to detect parasitic capacitance current and allow output current of the transconductance amplifier to be connected in-phase to the input of the CMOS transmission gate.

It is further an objective of the present disclosure to detect gate current of the N-channel and P-channel transistors of the transmission gate and apply that current to the input of the CMOS transmission gate.

Common to the prior art is the use of at least one transistor of any type, which can be controlled by a stimulus to make it alternately low resistive (in "on" state) and high resistive (in "off" state). There is also the presence of a stimulus that controls when the transistor(s) is in the "on" or "off" state and the existence of two electrically separate nodes (A & B shown in FIGS. 1A, 1B, and 2A), which are connected to either side of the transistor (or network of transistors).

The present disclosure would not work without the use of some element that senses the rate of change of voltage of the signal being propagated by the switch, (dv/dt). The invention also would not work without the use of some element or device that scales dv/dt with the known parasitic capacitances from the transistor(s), which results in a voltage or current that is proportional to the current that flows through the parasitic capacitances according to the equation, $i = C \cdot dv/dt$. In the example FIG. 3a, dv/dt is sensed by a simple RC network and an operational transconductance amplifier (OTA). The measured dv/dt is scaled by the $g_m$ of the OTA. In the example FIG. 3b, these required sensing and scaling functions are performed in one step by measuring the current that flows through the parasitic gate capacitance towards V+ (for the NMOS in the example) or V− (for the PMOS in the example). The current is proportional to both the capacitance and dv/dt.

The present disclosure also would not work without converting the measurement of the current in the parasitic capacitances into another current, which is sourced from the local power supply(ies) and is fed into the signal at node A or B, or both A and B, or at any node in-between which has equal electrical potential in the "on" state. In order to reduce the effective capacitance of the switch, the current that is fed back into the system must be of opposite polarity to the current flowing into the system through the parasitic devices. For example, raising the voltage of node A in FIG. 3a requires that current must flow from nodes A and B into the output of the inverter via the gate capacitance of the PMOS transistor, therefore the OTA must deliver some current back into node A.

BRIEF DESCRIPTION OF THE DRAWINGS

This invention will be described with reference to the accompanying drawings, wherein.

DETAILED DESCRIPTION

Figure 1A:
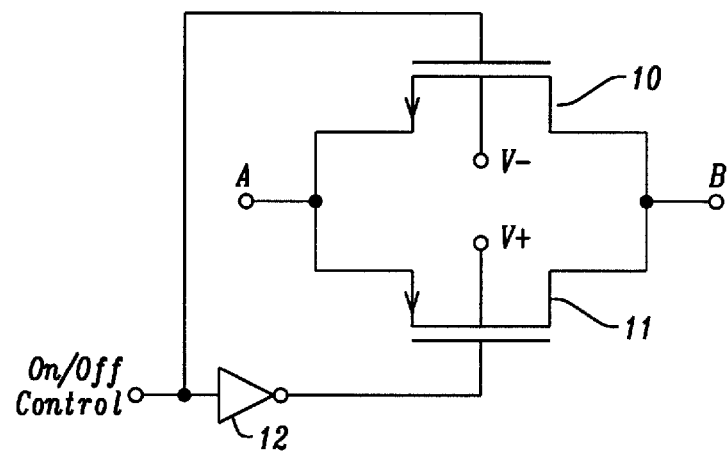
FIG. 1A is a circuit diagram of a CMOS transmission gate of the prior art.
Figure 1B:
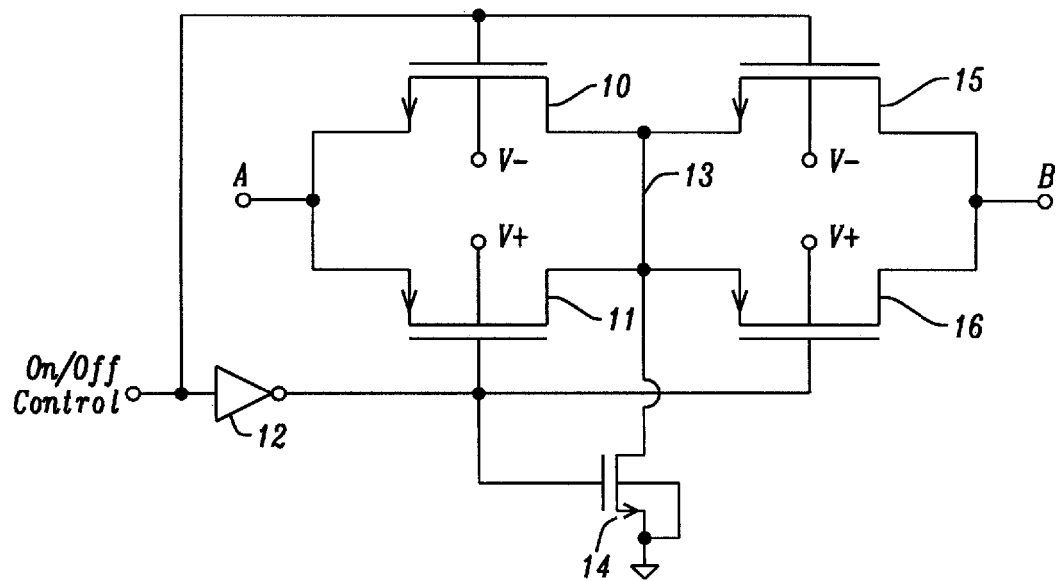
FIG. 1B is a circuit diagram of a tandem CMOS transmission gate of the prior art.
Figure 2A:
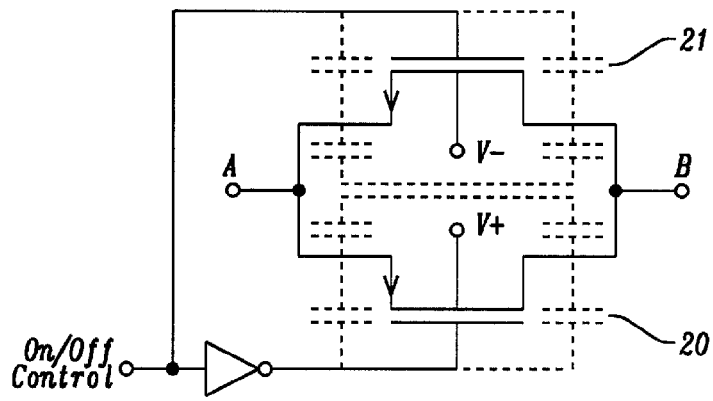
FIG. 2A is a circuit diagram of parasitic capacitance of a CMOS transmission gate of the present disclosure.
Figure 2B:
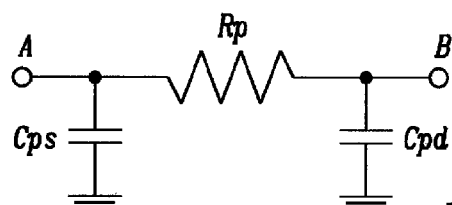
FIG. 2B is an equivalent circuit of the CMOS transmission gate of the present disclosure.

The most significant parasitic capacitances present in the simple transmission gate of FIG. 1a are illustrated in FIG. 2A and reduced to a simple model in FIG. 2B. In FIG. 2A is shown the main parasitic capacitances 20 associated with N-channel transistor and 21 associated with the P-channel transistor of a CMOS transmission gate, which affect signals that are switched from A to B. These capacitances include input capacitance from A to the gate of each transistor and from A to the substrate of each capacitor, and output capacitance from B to the gate of each transistor and B to the substrate of each transistor. FIG. 2B shows an equivalent circuit of the switch of FIG. 2A in which the two transistors of the switch are represented by a parallel resistance Rp to signals flowing from A to B, where Rp is a high value when the switch is biased off with a low logic signal, and Rp is a low resistance when the switch is biased on with a high logic signal. The input capacitance Cps is the equivalent of the parallel parasitic capacitance of the two transistors at point A and the output capacitance Cpd is the equivalent of the parallel parasitic capacitance of the two transistors at point B.

Figure 3A:
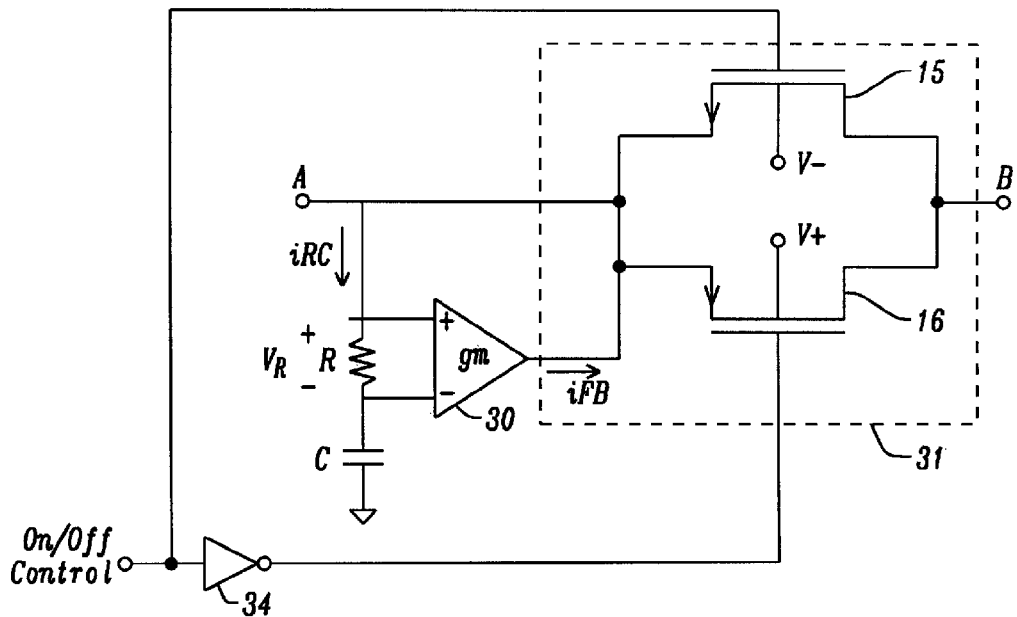
FIG. 3A is a circuit diagram of a transconductance amplifier detecting parasitic capacitance current to be applied to the input of a CMOS transmission gate.

In FIG. 3A a CMOS transmission gate 31 of the present disclosure is shown. The rate of change of an input signal voltage is sensed through a dedicated RC network.

Note that the sense capacitor, C, will add to the parasitic capacitance of the switch. An OTA (operational transconductance amplifier) 30 measures a current, $i_{RC}$, by measuring the voltage drop, $V_R$, across the resistor R of the RC network. The output of the OTC is applied back to the input of the CMOS transmission gate. The gain, $g_m$, of the OTA (operational transconductance amplifier) must be correctly set to account for the values of sense resistor, R, sense capacitor, C, and total parasitic capacitance, $C_{para}$ (which includes sense capacitance, C).

Sensed is $dv/dt=i_{RC}/C=V_R/(R \cdot C)$ where $i_{RC}=V_R/R$ and $dv/dt=V_R/(R \cdot C)$, and forced is the current $i_{FB} \lessapprox C_{para} \cdot dv/dt$ where $i_{FB}$ is less than lost current otherwise instability can occur, wherein $dv/dt=V_R/(R \cdot C)$; $i_{FB} \lessapprox (C_{para} \cdot V_R)/(R \cdot C) \gtrapprox g_m \cdot V_R$; $i_{FB}=g_m \cdot V_R$ and ∴ $g_m \cdot V_R \lessapprox (C_{para} \cdot V_R)/(R \cdot C)$. Therefore $g_m \lessapprox C_{para}/(R \cdot C)$ This method is suitable as long as the parasitic capacitances are known. Positive feedback means instability will occur if loop gain is greater than or equal to one. It also relies on the RC time constant of the sense components being significantly shorter than the rise/fall times of the switching signal.

Figure 3B:
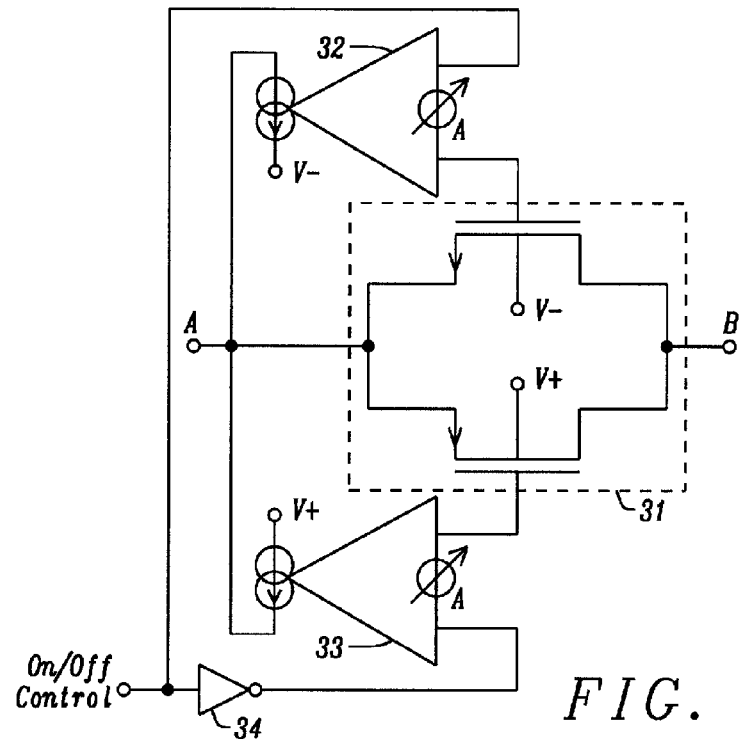
FIG. 3B is a circuit diagram of current amplifiers connected to a CMOS transmission gate to detect and feed back parasitic capacitance current.

In FIG. 3B the parasitic capacitance does not need to be known because it is sensed directly by current amplifiers 32 and 33. A first input to current amplifier 32 is connected to the gate of the N-channel transistor of the CMOS transmission gate 31 and a first input to current amplifier 33 is connected to the gate of the P-channel transistor. The second input to current amplifier 32 is connected to the CMOS transmission gate on/off input and the second input to current amplifier 33 is connected to the output of the inverter circuit 34, which is connected to the transmission gate on/off input. The most dominate current that is "lost" through the parasitic capacitance surrounding the transistor gates is sensed directly and mirrored back into the signal path. For this reason, the size of the transistors is unimportant and the same compensation circuit can be applied to any size of switch, providing that the maximum current, accuracy, and speed are suitable.

The gain of the two current amplifiers 32 and 33 is set to be less than unity to insure circuit stability; therefore, the amount of compensation of the effects of the parasitic capacitance is somewhat less than one hundred percent. However, most of the loss through the parasitic capacitance is compensated.

Figure 3C:
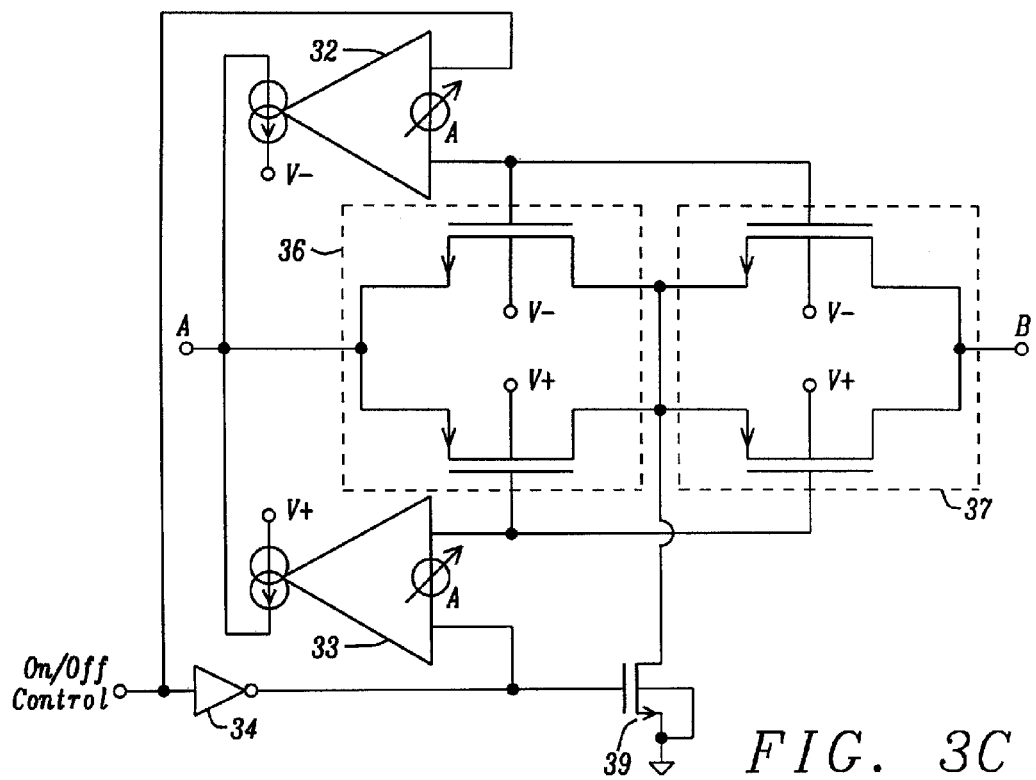
FIG. 3C is a circuit diagram of current amplifiers connected to a tandem CMOS transmission gate to detect and feed back parasitic capacitance current.

In FIG. 3C the same concept as in FIG. 3B is applied to a transistor switch architecture, which provides better isolation in the "off" state. There are two CMOS transmission switches 36 and 37 connected in tandem. An N-channel transistor 39 is used to ground the tandem connection to insure isolation between input A and output B of the tandem switch. The gates of the two N-channel transistors are connected together and connected to a first input of current amplifier 32. The second input to the current amplifier 32 is connected to on/off control input of the tandem transistor switch. The output of amplifier 32 is connected to input A of the tandem transistor switch. The gates of the two P-channel transistors are connected together and connected to a first input to current amplifier 33. The second input to current amplifier 33 is connected to the output of the inverter circuit 34, and the output of current amplifier 33 is connected to input A of the tandem transistor switch. The gain of the current amplifiers 32 and 33 is set to be less than one (1) to maintain stability of the circuitry since the feedback that is accomplished is positive feedback.

Current flowing into, or out of, the gates of the transistors that make up the CMOS transmission switches comprises current required by the gates to operate and capacitive current required to charge (discharge) the parasitic capacitance that surrounds the transistors than make up the CMOS transmission switch as shown in FIG. 2A. Therefore, since the signal connected to input A is less than unity, the correction for the effects of the parasitic capacitance is less than total, but most of the effects of the parasitic capacitance is compensated for.

When implicitly sensing the current lost through switch parasitic capacitance any type of capacitor might be suitable for emulating the parasitic capacitance before scaling (capacitor C in FIG. 3A), however the most suitable type of capacitor would probably be a MOSCAP (capacitor formed across the gate-oxide of a MOS transistor), since the MOSCAP could be matched to the dimension, orientation, and electrical characteristics of the switch transistor. Such matching would lead to a roughly constant relationship between the sensed current and the total lost current.

When explicitly sensing the current lost through the parasitic capacitance of the switch, no additional sensing capacitor is required, although additional capacitors could be utilized to further emulate parasitic capacitances other than the gate-drain and gate-source capacitances. However, to some extent the additional parasitic capacitance present will be proportional to the gate-source and gate-drain capacitances and so increasing the ratio of fed-back current to sensed current would be sufficient. In all sensing schemes (implicit and explicit sensing) it is important that the ratio of total fed-back current to total lost current ($\Sigma i_{FB}/\Sigma i_{LOST}$) does not exceed the value of one (1). It should also be clear that $\Sigma i_{FB}/\Sigma i_{LOST}$ should not equal the value of one (1) since any mismatch or variation could then cause $\Sigma i_{FB}/\Sigma i_{LOST}$ to exceed one. If $\Sigma i_{FB}/\Sigma i_{LOST}$ exceeds the value of one then the circuit wants to inject more current into the signal than would be lost through the parasitic capacitance. This means that any signal change, including that caused by noise falling within the bandwidth of the circuit, could cause the circuit to push exponentially more current into or out of the signal until the circuit saturates. It would then be possible that the circuit overpower the original source of the signal.

One possible application for the circuit concept described is for a switch to optionally pass or block USB data signals, depending on whether the switch is chosen to be "on" or "off". USB data signals (transmitted on two separate wires) should have a differential amplitude between 200 mV-400 mV, switching at speeds from 1.5 Mb/s (low-speed), to 12 Mb/s (full-speed), 480 Mb/s (high-speed), and 5 Gb/s (Super-Speed). Data lines are terminated by impedances from 18Ω to 45Ω and the data integrity relies on the ability of the data-line to pass signals from the transmitter to the receiver without large overshoots or attenuation. The ideal data line would have zero capacitance and zero impedance, allowing the transmitter and receiver to completely define the signal characteristics as defined in the USB standard specifications. But when multiplexing is required to facilitate the sharing of 2 pins for multiple functions, one of these being USB data communication, then inevitably a switch will be required in the data-line which will add additional capacitance and impedance. To get as close to the ideal data-line as possible, the switch should be low impedance (meaning it will be large), and should introduce minimum capacitance. Because larger switches introduce larger capacitance, the capacitance minimization concept described in this invention can be used.

While the invention has been particularly shown and described with reference to preferred embodiments thereof, it will be understood by those skilled in the art that various changes in form and details may be made without departing from the spirit and scope of the invention.

What is claimed is:

1. A capacitance minimization circuit, comprising:
   a) a CMOS transmission gate comprising signal loss caused by parasitic capacitances; and
   b) an amplifier circuit connected to an input of the CMOS transmission gate, wherein said amplifier circuit is configured to sense a rate of change of an input signal voltage of the CMOS transmission gate indicating a signal loss caused by the parasitic capacitances and to feed back a current according the signal loss caused by the parasitic capacitances to the input of the CMOS transmission gate in order to compensate the signal loss, wherein said amplifier circuit is an operational transconductance amplifier configured to sense the rate of change of the input signal voltage via a voltage drop across a resistor of an RC network, comprising the resistor and a capacitor connected in series, wherein the RC network is connected between the input of the CMOS transmission gate and ground, wherein the operational transconductance amplifier is further configured to provide an output current to the input of the CMOS transmission gate to compensate the signal loss due to the parasitic capacitances.

2. The circuit of claim 1, wherein said operational transconductance amplifier forms a part of a positive feedback loop, wherein the loop gain is set to be less than one.

3. A method of capacitance minimization, comprising:
   a) forming a CMOS transmission gate with an N-channel transistor connected in parallel with a P-channel transistor between an input and an output; and
   b) connecting an amplifier in series to the input of the CMOS transmission gate in order to implicitly or explicitly sense a rate of change of an input signal voltage of the CMOS transmission gate indicating a signal loss caused by parasitic capacitances of the CMOS transmission gate and to feed back a current according to the signal loss caused by the parasitic capacitance of the CMOS transmission gate to an input of the CMOS transmission gate in order to compensate the signal loss, wherein the amplifier is a transconductance amplifier capable of sensing the rate of change of the input signal voltage by sensing a voltage drop across a resistor of a RC network, comprising a resistor and a capacitor connected in series, wherein the RC network is connected between the input of the CMOS transmission gate and ground, wherein the operational transconductance amplifier is further configured to provide an output current to the input of the CMOS transmission gate to compensate the signal loss due to the parasitic capacitances.

4. The circuit of claim 1, wherein said operational transconductance amplifier has a gain of less than 1.

5. The method of claim 3, wherein said amplifier has a gain of less than 1.

* * * * *